(12) United States Patent
Park

(10) Patent No.: US 9,001,596 B2
(45) Date of Patent: Apr. 7, 2015

(54) NONVOLATILE MEMORY APPARATUS INCLUDING SHARING DRIVER CAPABLE OF PERFORMING BOTH OF READ AND WRITE OPERATION

(71) Applicant: SK Hynix Inc., Icheon-si Gyeonggi-do (KR)

(72) Inventor: Chul Hyun Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 103 days.

(21) Appl. No.: 13/846,673

(22) Filed: Mar. 18, 2013

(65) Prior Publication Data

US 2014/0177353 A1    Jun. 26, 2014

(30) Foreign Application Priority Data

Dec. 21, 2012    (KR) .................. 10-2012-0150159

(51) Int. Cl.
G11C 7/00 (2006.01)
G11C 7/06 (2006.01)
G11C 7/14 (2006.01)
G11C 13/00 (2006.01)
G11C 16/10 (2006.01)

(52) U.S. Cl.
CPC  *G11C 7/062* (2013.01); *G11C 7/14* (2013.01); *G11C 13/0002* (2013.01); *G11C 13/0038* (2013.01); *G11C 13/004* (2013.01); *G11C 13/0069* (2013.01); *G11C 2013/0054* (2013.01); *G11C 16/10* (2013.01)

(58) Field of Classification Search
CPC ....... G11C 7/22; G11C 7/1072; G11C 7/1006
USPC .................. 365/189.14, 189.07, 189.09, 208
See application file for complete search history.

(56) References Cited

U.S. PATENT DOCUMENTS

| | | | | |
|---|---|---|---|---|
| 6,154,404 | A * | 11/2000 | Hwang | 365/205 |
| 6,982,913 | B2 * | 1/2006 | Oh et al. | 365/203 |
| 7,894,236 | B2 * | 2/2011 | Oh et al. | 365/148 |
| 7,907,435 | B2 | 3/2011 | Osada et al. | |
| 8,659,930 | B2 * | 2/2014 | Yim et al. | 365/148 |
| 2014/0003167 | A1 * | 1/2014 | Jung | 365/189.14 |

\* cited by examiner

*Primary Examiner* — Connie Yoha
(74) *Attorney, Agent, or Firm* — William Park & Associates Patent Ltd.

(57) ABSTRACT

A nonvolatile memory apparatus includes a read/write control unit and a voltage generation unit and the memory cell. The read/write control circuit is configured to supply a bias voltage in response to a read control signal, a write control signal and data. The voltage generation unit is configured to compare a level of the bias voltage with a voltage level of a sensing node and drive the sensing node at voltage having a constant level based on a result of the comparison. The memory cell coupled with the sensing node and configured to receive the voltage having the constant level.

14 Claims, 6 Drawing Sheets

NONVOLATILE MEMORY APPARATUS INCLUDING SHARING DRIVER CAPABLE OF PERFORMING BOTH OF READ AND WRITE OPERATION

CROSS-REFERENCES TO RELATED APPLICATION

The present application claims priority under 35 U.S.C. §119(a) to Korean application number 10-2012-0150159, filed on Dec. 21, 2012, in the Korean Intellectual Property Office, which is incorporated herein by reference in its entirety.

BACKGROUND

1. Technical Field

The present invention generally relates to a semiconductor apparatus, and more particularly, to a memory apparatus including nonvolatile memory cells.

2. Related Art

A known DRAM includes memory cells formed of capacitors and stores data while charging electric charges into the memory cells or discharging electric charges from the memory cells. However, the DRAM has a disadvantage of a volatile memory because the capacitor has a leakage current. In order to improve the disadvantage of the DRAM, nonvolatile memories not requiring the retention of data are being developed. In particular, attempts to implement a nonvolatile memory by changing the structure of a memory cell continue to be made. One of the attempts is a resistive memory apparatus including resistive memory cells.

FIG. 1 is a schematic diagram showing the construction of a known nonvolatile memory apparatus. Referring to FIG. 1, the known nonvolatile memory apparatus 10 includes a memory cell 11, a first transistor N1, a second transistor N2, a third transistor N3, a read sense amplifier 12, and a write driver 13. The memory cell 11 is made of a resistive material having a resistance value that varies depending on temperature or the amount of an electric current. The memory cell 11 has a different resistance value according stored data. Furthermore, the memory cell 11 includes a diode so that an electric current can flow in one direction.

The first transistor N1 couples the read sense amplifier 12 with the memory cell 11 in response to a bit line selection signal BLS supplied to the gate of the first transistor N1. The second transistor N2 couples the write driver 13 with the memory cell 11 in response to the bit line selection signal BLS. The third transistor N3 couples the is memory cell 11 with a terminal for a ground voltage VSS in response to a word line selection signal WLS, thus forming a current path to the memory cell 11.

The read sense amplifier 12 supplies a read current IRD in response to a read control signal RD. The write driver 13 supplies a write current IWT in response to a write control signal WT and data DATA. In response to the read control signal RD, the bit line selection signal BLS, and the word line selection signal WLS for a read operation, the read sense amplifier 12 supplies the read current IRD to the memory cell 11, senses voltage VSEN varying depending on a resistance value of the memory cell 11, and outputs data according to the sensed voltage. In response to the write control signal WT, the data DATA, the bit line selection signal BLS, and the word line selection signal WLS for a write operation, the write driver 13 supplies the write current IWT to the memory cell 11 so that a resistance value of the memory cell 11 is changed depending on the intensity of the write current IWT.

The read sense amplifier 12 and the write driver 13 have respective current mirror structures in order to generate the read current IRD and the write current IWT respectively. The current mirror consumes a large amount of an electric current and the current driving ability of the current mirror is changed depending on a position, thereby limiting the dispositions of the read sense amplifier 12 and the write driver 13. Furthermore, in a method of supplying the read current IRD and the write current IWT, data stored in the is memory cell 11 can be altered in a read operation because a peak current according to switching is generated, with the result that a possibility that data different from desired data can be stored in the memory cell 11 in a write operation is increased. Furthermore, the read sense amplifier 12 uses a first high voltage VPPSA to generate the read current IRD, and the write driver 13 uses a second high voltage VPPWD to generate the write current IWT. As a result, the amount of an electric current necessary to generate the first and the second high voltages VPPSA and VPPWD is increased.

SUMMARY

A nonvolatile memory apparatus capable of integrating a read sense amplifier and a write driver and sensing an electric current flowing through a memory cell by supplying voltage having a constant level is described herein.

A nonvolatile memory apparatus capable of integrating a read sense amplifier and a write driver and sensing an electric current flowing through a memory cell by supplying voltage having a constant level is described herein.

In an embodiment of the present invention, a nonvolatile memory apparatus includes a read/write control unit configured to supply a bias voltage in response to a read control signal, a write control signal, and data, a voltage generation unit configured to compare a level of the bias voltage with a voltage level of a sensing node and drive the sensing node at voltage having a constant level is based on a result of the comparison, and a memory cell coupled with the sensing node and configured to receive the voltage having the constant level.

In an embodiment of the present invention, a nonvolatile memory apparatus includes a sharing driver unit configured to supply a sensing node with voltage having a constant level in response to a read control signal, a write control signal, and data, a memory cell configured to have a first terminal coupled with the sensing node and receive the voltage having the constant level, and a current sensing unit coupled with the second terminal of the memory cell and configured to sense an electric current flowing through the memory cell and generate a data output signal based on a result of the sensing.

In an embodiment of the present invention, a nonvolatile memory apparatus includes a sharing read/write control unit configured to supply a bias voltage to a plurality of memory blocks in response to a read control signal, a write control signal, and data, a block switch configured to supply the bias voltage to a memory block, selected from the plurality of memory blocks, in response to a block selection signal, a voltage generation unit configured to receive the bias voltage from the block switch, compare a level of the received bias voltage with a voltage level of a sensing node, and drive the sensing node at voltage having a constant level based on a result of the comparison, and a memory cell coupled with the sensing node and configured to receive the voltage having the constant level.

BRIEF DESCRIPTION OF THE DRAWINGS

Features, aspects, and embodiments are described in conjunction with the attached drawings, in which.

DETAILED DESCRIPTION

Hereinafter, a nonvolatile memory apparatus according to the present invention will be described below with reference to the accompanying drawings through various embodiments.

Figure 1:
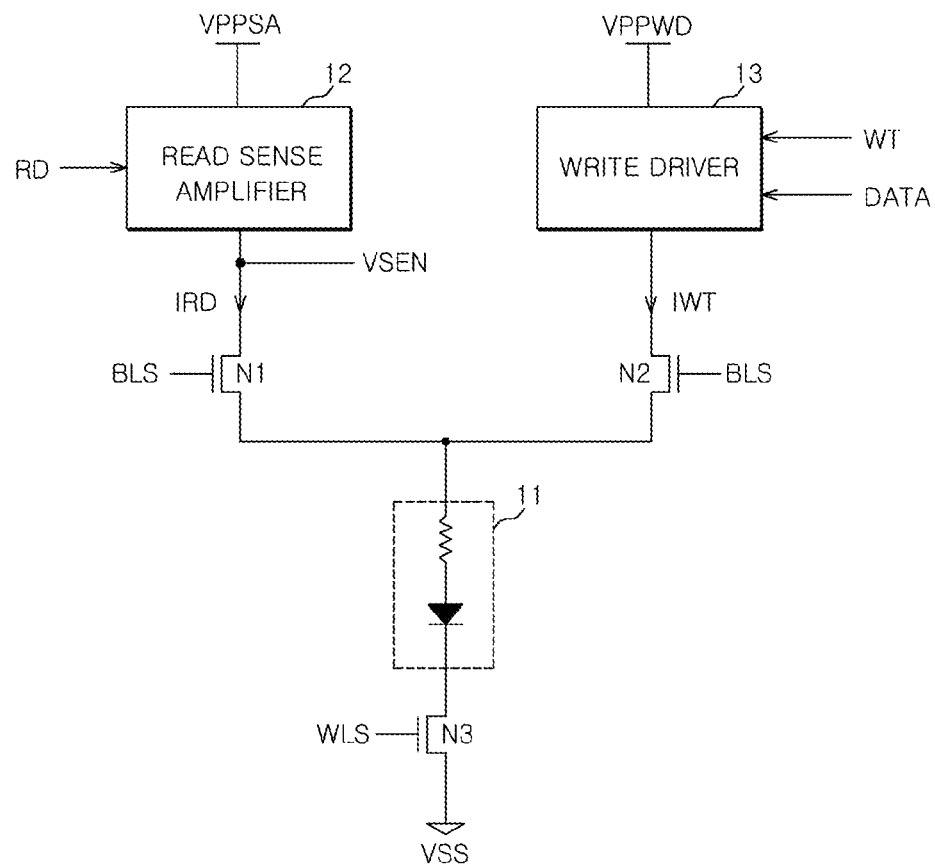
FIG. 1 is a schematic diagram showing the construction of a known nonvolatile memory apparatus.
Figure 2:
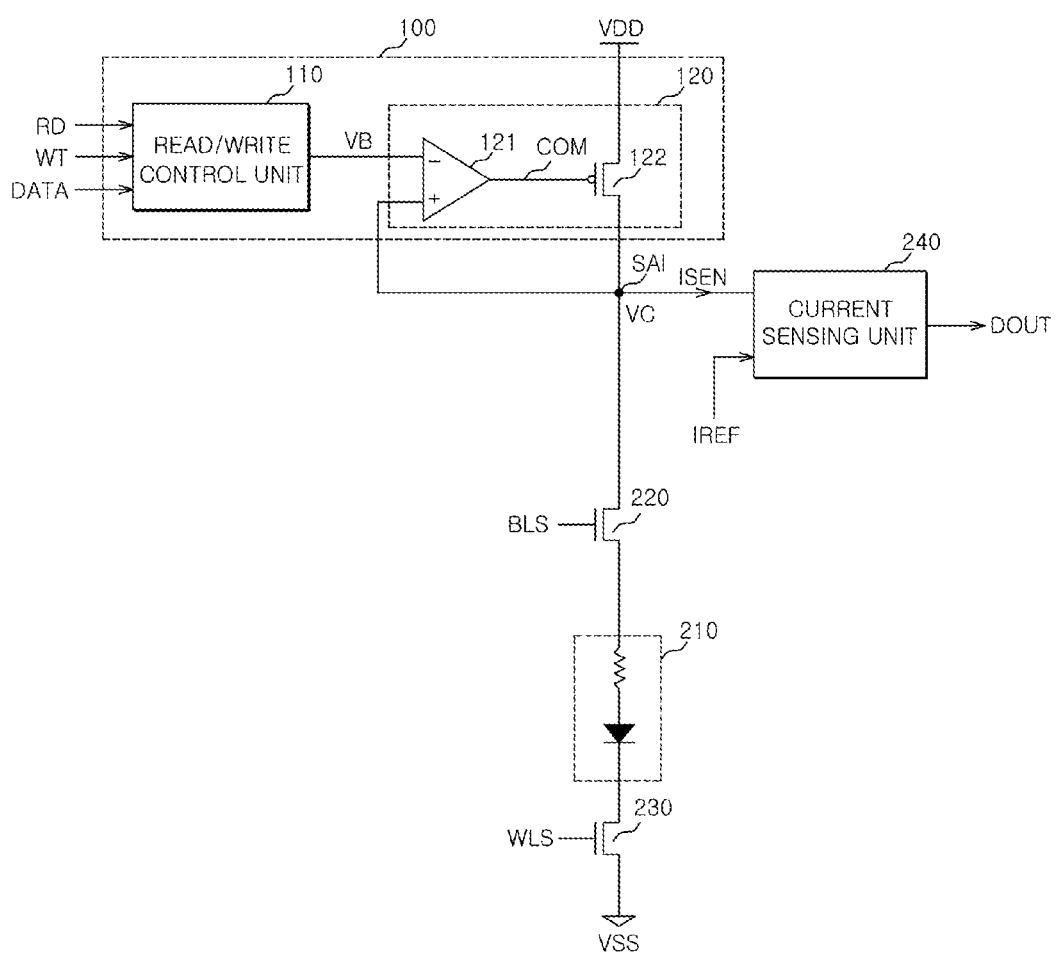
FIG. 2 is a diagram showing a construction of a nonvolatile memory apparatus in accordance with an embodiment of the present invention.

FIG. 2 is a diagram showing a construction of a nonvolatile is memory apparatus in accordance with an embodiment of the present invention. Referring to FIG. 2, the nonvolatile memory apparatus 1 may include a sharing driver unit 100 and a memory cell 210 (only one memory cell is shown for simplicity). The sharing driver unit 100 supplies a sensing node SAI with voltage VC having a constant level in response to a read control signal RD, a write control signal WT, and data DATA. The read control signal RD is an internal signal generated from a read command that is received from a processor or a controller (not shown) when the nonvolatile memory apparatus 1 performs a read operation. The write control signal WT is an internal signal generated from a write command that is received from the processor or the controller when the nonvolatile memory apparatus 1 performs a write operation.

The sharing driver unit 100 can drive the sensing node SAI in response to the read control signal RD so that the sensing node SAI regularly maintains the voltage VC having a first level in a read operation. The voltage VC of the first level is supplied to sense data stored in the memory cell 210 when a read operation is performed. Furthermore, the sharing driver unit 100 can drive the sensing node SAI in response to the write control signal WT and the data DATA so that the sensing node SAI regularly maintains the voltage VC having one of second and third levels. The voltage VC of the second or third level can be supplied to write set data and reset data into the memory cell 210. In an embodiment of the present invention, the memory cell 210 is illustrated as storing single-level data. The is present embodiments of the present invention can also be applied to a nonvolatile memory apparatus including a memory cell for storing multi-level data. The sharing driver unit 100 can supply the voltage VC having a larger number of levels in order to store multi-level data in the memory cell 210 or output multi-level data from the memory cell 210. For example, the voltage VC can have two levels in a read operation, and the voltage VC can have three levels in a write operation.

The memory cell 210 is coupled with the sensing node SAI and configured to receive the voltage VC having a constant level from the sensing node SAI. The memory cell 210 can receive the voltage VC having a constant level and generate an electric current that flows through the memory cell 210 by using the received voltage VC. In a read operation, the memory cell 210 can change a sensing current ISEN in response to its own resistance value. Furthermore, in a write operation, the memory cell 210 can receive the voltage VC having a constant level from the sharing driver unit 100 via the sensing node SAI and can store desired data by changing its own resistance value in such a way as to change the amount of an electric current that flows through the memory cell 210 in response to the amount of the received voltage VC.

Again, referring to FIG. 2, the sharing driver unit 100 can include a read/write control unit 110 and a voltage generation unit 120. The read/write control unit 110 generates a bias voltage VB in response to the read control signal RD, the write control signal WT, and the data DATA. The read/write control unit 110 can generate the bias voltage VB having the first level in response to the read control signal RD and can generate the bias voltage VB having the second or third level in response to the write control signal WT and the data DATA.

The voltage generation unit 120 can compare a level of the bias voltage VB with a voltage level of the sensing node SAI and drive the sensing node SAI at the voltage VC having a constant level based on a result of the comparison. The voltage generation unit 120 can make a voltage level of the sensing node SAI and a level of the bias voltage VB substantially the same.

The voltage generation unit 120 can include a comparator 121 and a driver 122. The comparator 121 can compare a level of the bias voltage VB with a voltage level of the sensing node SAI and generate a comparison signal COM based on a result of the comparison. The driver 122 supplies a power source voltage VDD to the sensing node SAI in response to the comparison signal COM. The comparator 121 and the driver 122 receive voltage fed back from the sensing node SAI and drive the sensing node SAI at the power source voltage VDD based on a result of a comparison between the fed-back voltage of the sensing node SAI and the bias voltage VB. Accordingly, the voltage generation unit 120 can maintain a voltage level of the sensing node SAI regularly and substantially identically with a level of the bias voltage VB. The driver 122 can include a PMOS transistor. The comparison signal COM and the power source voltage VDD are is inputted to the respective gate and source of the PMOS transistor, and the drain of the PMOS transistor is coupled with the sensing node SAI.

Still referring to FIG. 2, the nonvolatile memory apparatus 1 can further include a column switch 220 and a row switch 230. The column switch 220 couples one terminal of the memory cell 210 with the sensing node SAI in response to a bit line selection signal BLS. The bit line selection signal BLS can be generated from a column address signal in order to select the memory cell 210 that is accessed. The row switch 230 couples the other terminal of the memory cell 210 with a ground voltage VSS in response to a word line selection signal WLS. The word line selection signal WLS can be generated from a row address signal in order to select the memory cell 210 that is accessed.

The nonvolatile memory apparatus 1 can further include a current sensing unit 240. The current sensing unit 240 can be coupled with the sensing node SAI. The current sensing unit 240 receives the sensing current ISEN through the sensing node SAI. The current sensing unit 240 can compare the sensing current ISEN with a reference current IREF and generate a data output signal DOUT based on a result of the comparison. The reference current IREF can be supplied from a reference cell (not shown), for example.

Figure 3:
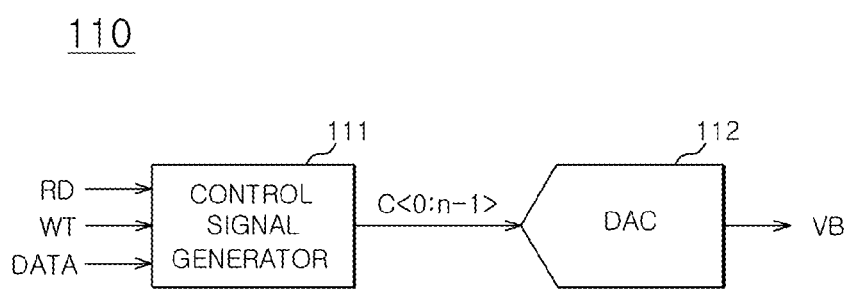
FIG. 3 is a schematic block diagram showing an embodiment of the construction of a read/write control unit of FIG. 2.

FIG. 3 is a schematic block diagram showing an embodiment of the construction of the read/write control unit 110 of FIG. 2. Referring to FIG. 3, the read/write control unit 110 may is include a control signal generator 111 and a Digital Analog Converter (DAC) 112. The control signal generator 111 generates digital code signals C<0:n−1> in response to the read control signal RD, the write control signal WT, and the data DATA. The control signal generator 111 generates the digital code signals C<0:n−1> in response to the read control signal RD so that the bias voltage VB having the first level can be generated and generates the digital code signals C<0:n−1> in response to the write control signal WT and the data DATA so that the bias voltage VB having the second or third level can be generated. The control signal generator 111 can be implemented as a state machine, for example. That is, the control signal generator 111 can generate the digital code signals C<0:n−1> having preset code values in response to the read control signal RD, the write control signal WT, and the data DATA. In various embodiments, the control signal generator 111 can further include a correction circuit for partially correcting code values of the digital code signals C<0:n−1> in order to compensate for a change of PVT in the nonvolatile memory apparatus or finely control a level of voltage supplied to the memory cell.

The DAC 112 generates the bias voltage VB in response to the digital code signals C<0:n−1>. The nonvolatile memory apparatus 1 generates the bias voltage VB for performing a read operation and a write operation by using the control signal generator 111 and the DAC 112. Accordingly, current consumption can be reduced as compared with a method using a known current mirror, a is more circuit area can be secured, and the sharing driver unit 100 can be freely disposed.

Figure 4A:
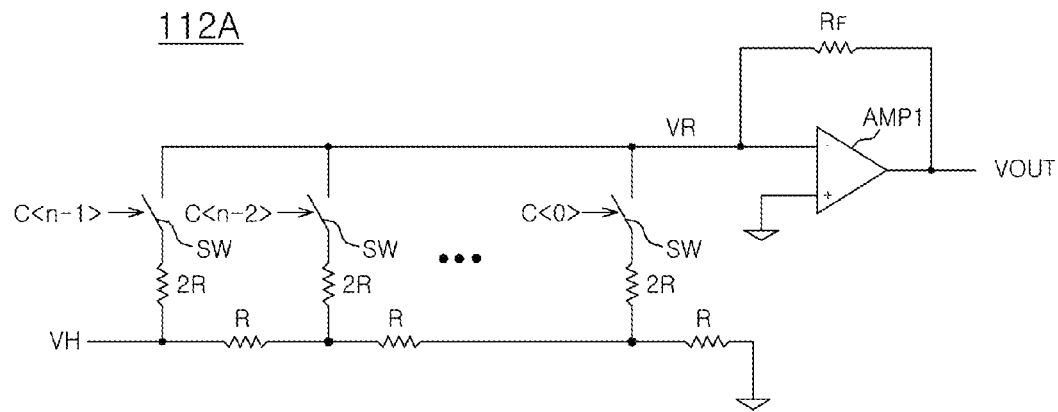
FIGS. 4A and 4B are diagrams showing embodiments of the constructions of DACs of FIG. 3.
Figure 4B:
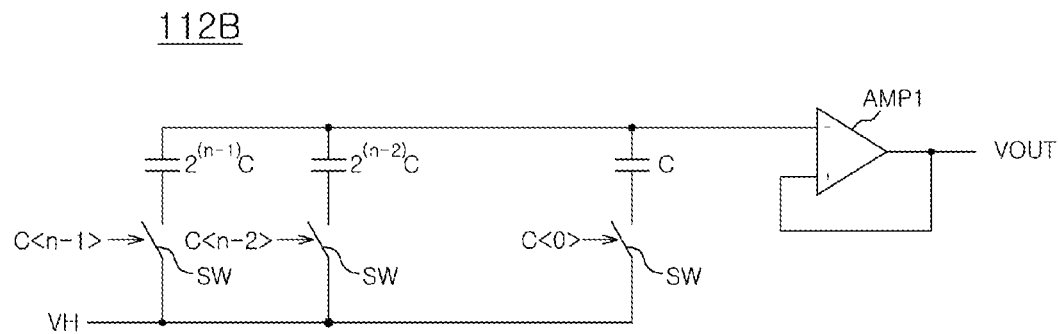

FIG. 4A is a diagram showing an embodiment of the construction of the DAC 112 of FIG. 3, and FIG. 4B is a diagram showing an embodiment of the construction of the DAC 112 of FIG. 3. Referring to FIG. 4A, the DAC 112A may include a plurality of resistors R coupled together in series, a plurality of resistors 2R coupled together in parallel, a plurality of switches SW configured to receive the digital code signals C<0:n−1> and coupled with the respective resistors 2R in series, a resistor $R_F$, and a comparator AMP1. The DAC 112A generates a division voltage VR by changing a division ratio of a high voltage VH depending on the number of switches SW that are turned on, and the resistor $R_F$ and the comparator AMP1 generate an output voltage VOUT from the division voltage VR. The high voltage VH, even if it is divided, may be voltage having a high level enough to generate the bias voltage VB having the first level for a read operation and the bias voltage VB having the second or third level for a write operation. A boosting voltage internally generated from the nonvolatile memory apparatus 1 can be used as the high voltage VH. The DAC 112A can generate the output voltage VOUT having a variety of levels depending on the number of switches SW that are turned on in response to logic values of the digital code signals C<0:n−1>.

Referring to FIG. 4B, the DAC 112B may include a plurality of capacitors $2^{(n-1)}C$, $2^{(n-2)}C$, and C coupled together in parallel, a plurality of switches SW configured to receive the digital code signals C<0:n−1> and coupled with the respective capacitors $2^{(n-1)}C$, $2^{(n-2)}C$, and C in series, and a comparator AMP1. Like the DAC 112A of FIG. 4A, the DAC 112B can generate the output voltage VOUT having a variety of levels depending on the number of switches SW that are turned on in response to logic values of the digital code signals C<0:n−1>. The DAC 112A of FIG. 4A is advantageous in that a circuit area is small because it uses the resistors. The DAC 112B of FIG. 4B is advantageous in that current consumption may be less because the DAC 112B uses the capacitors.

An operation of the nonvolatile memory apparatus 1 in accordance with an embodiment of the present invention is described below with reference to FIGS. 2 to 4B. In the read operation of the nonvolatile memory apparatus 1, the memory cell 210 is selected in response to the bit line selection signal BLS and the word line selection signal WLS. The read/write control unit 110 generates the bias voltage VB having the first level in response to the read control signal RD. The voltage generation unit 120 drives the sensing node SAI so that a voltage level of the sensing node SAI is the same as a level of the bias voltage VB. That is, voltage of the sensing node SAI is maintained to the voltage VC having a constant level. The memory cell 210 changes the amount of the sensing current ISEN depending on its own resistance value or stored data. The current sensing unit 240 compares the sensing current ISEN with the reference current IREF and generates the data output signal DOUT based on a result of is the comparison.

In the write operation of the nonvolatile memory apparatus 1, the memory cell 210 is selected in response to the bit line selection signal BLS and the word line selection signal WLS. The read/write control unit 110 generates the bias voltage VB having the second level or the third level in response to the write control signal WT and the data DATA. The voltage generation unit 120 drives the sensing node SAI so that a voltage level of the sensing node SAI is the same as a level of the bias voltage VB. That is, voltage of the sensing node SAI is maintained to the voltage VC having a constant level. When voltage of the sensing node SAI is maintained to the voltage VC having the second level or the third level and a current path is formed from the memory cell 210 to the ground voltage VSS, a specific current flows into the memory cell 210. Accordingly, the memory cell 210 can change its own resistance value in response to the specific current and store data according to the change resistance value.

Figure 5:
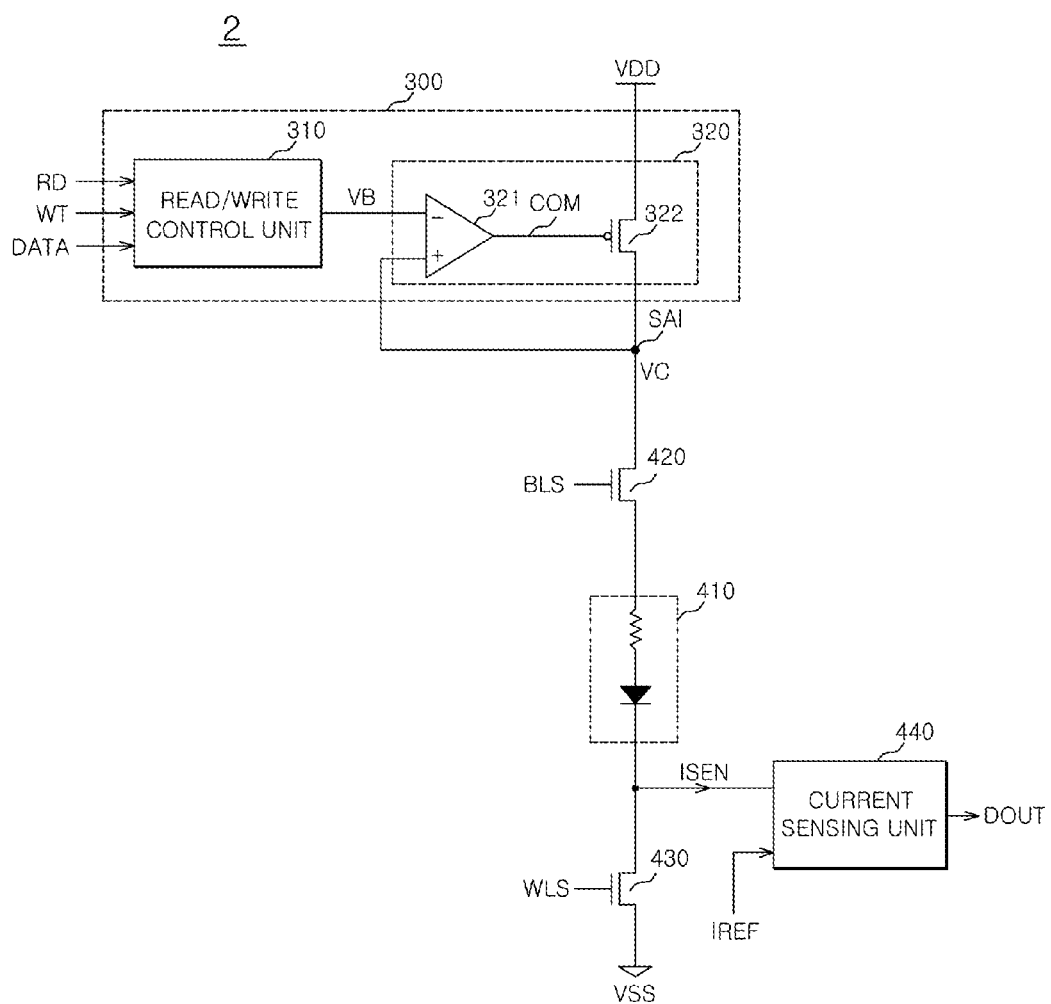
FIG. 5 is a diagram showing a construction of a nonvolatile memory apparatus in accordance with an embodiment of the present invention.

FIG. 5 is a diagram showing a construction of a nonvolatile memory apparatus 2 in accordance with an embodiment of the present invention. Referring to FIG. 5, the nonvolatile memory apparatus 2 may include a sharing driver unit 300, a memory cell 410 (only one memory cell is shown for simplicity), a column switch 420, a row switch 430, and a current sensing unit 440. The disposition of the sharing driver unit 300, the memory cell 410, the column switch 420, and the row switch 430 are the same as those of the nonvolatile is memory apparatus 1 of FIG. 2. Thus, wherever possible, the same reference numbers will be used throughout the drawings to refer to the same or like parts. Like FIG. 2, FIG. 5 illustrates a read/write control unit 310, a comparator 321, a driver 322, and a voltage generation unit 320.

Referring to FIG. 5, one terminal of the memory cell 410 is coupled with a sensing node SAI, and the other terminal of the memory cell 410 is coupled with the current sensing unit 440. That is, the current sensing unit 440 receives a sensing current ISEN, flowing through the memory cell 410, on the row switch 430 or word line's side. The current sensing unit 440 compares the sensing current ISEN with a reference current IREF and generates a data output signal DOUT based on a result of the comparison.

In a read operation, a known nonvolatile memory apparatus supplies a read current to a memory cell, senses a voltage level varying in response to a resistance value of the memory cell, and generates a data output signal based on a result of the sensing. In contrast, the nonvolatile memory apparatus 2 in accordance with an embodiment of the present invention supplies the voltage VC having a constant level to the sensing node SAI, senses an amount of an electric current varying in response to a resistance value of the memory cell 410, and generates the data output signal DOUT based on a result of the sensing. Accordingly, the current sensing unit 440 does not need to be necessarily located on the sensing node (SAI)' side and can be located on the row switch 430 or the word line's side. If the current sensing unit 440 is disposed on the row switch 430 or the word line's side, an additional current path, such as a path for copying the sensing current ISEN, does not need to be formed because the current sensing unit 440 can directly receive the sensing current ISEN flowing through the memory cell 410. Furthermore, if the current sensing unit 440 is disposed on the row switch 430 or the word line's side, a circuit area can be efficiently used because a construction for the sharing driver unit 300 can be separated from a construction for the current sensing unit 440.

Figure 6:
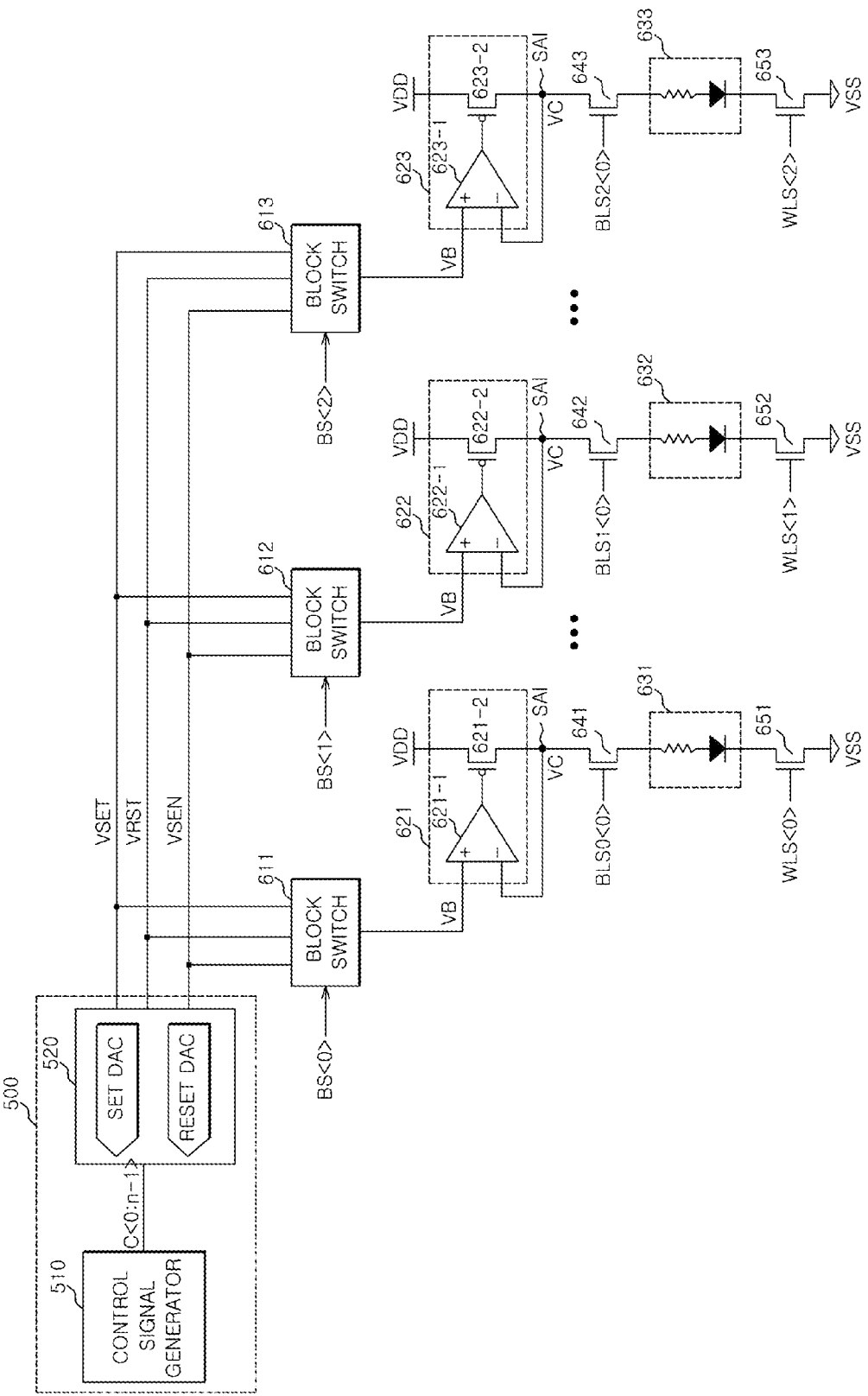
FIG. 6 a diagram showing a construction of a nonvolatile memory apparatus in accordance with an embodiment of the present invention.

FIG. 6 a diagram showing a construction of a nonvolatile memory apparatus 3 in accordance with yet another embodiment of the present invention. Referring to FIG. 6, the nonvolatile memory apparatus 3 may include a read/write control unit 500, a plurality of block switches 611 to 613, a plurality of voltage generation units 621 to 623, and a plurality of memory cells 631 to 633. The read/write control unit 500 has the same construction as the read/write control unit 110 of FIG. 2 and supplies a bias voltage VB for the plurality of memory cells 631 to 633 of a plurality of memory blocks. The bias voltage can include a set voltage VSET, a reset voltage VRST, and a read voltage VSEN.

Referring to FIG. 6, the read/write control unit 500 may include a control signal generator 510 and a DAC 520. The DAC 520 can include a set DAC and a reset DAC. The set DAC can generate the set voltage VSET for storing set data in response to digital code signals C<0:n−1> generated from the control signal generator 510, and the reset DAC can generate the reset voltage VRST for storing reset data in response to the digital code signals C<0:n−1>. Furthermore, one of the set DAC and the reset DAC can generate the read voltage VSEN for reading data in response to the digital code signals C<0:n−1>.

The block switches 611 to 613 function to select memory blocks including a plurality of memory cells. For example, the first memory cell 631 can be included in a first memory block, the second memory cell 632 can be included in a second memory block, and the third memory cell 633 can be included in a third memory block. The first block switch 611 can be turned on in response to a block selection signal BS<0> in order to select the first memory block including the first memory cell 631. The second block switch 612 can be turned on in response to a block selection signal BS<1> in order to select the second memory block including the second memory cell 632. The third block switch 613 can be turned on in response to a block selection signal BS<2> in order to select the third memory block including the third memory cell 633. The block selection signals BS<0:2> can be generated from a column address signal and/or a row address signal.

The plurality of voltage generation units 621 to 623 receive the bias voltage VB from the respective first to third block switches 611 to 613. Each of the plurality of voltage generation units 621 to 623 compares a level of the bias voltage VB with a voltage level of a sensing node SAI and supplies voltages VC having a constant level to is the sensing node SAI based on a result of the comparison. That is, the voltage generation units 621 to 623 drive the respective sensing nodes SAI so that the sensing node SAI substantially has the same level as the bias voltage VB.

The memory cells 631 to 633 are coupled with the respective sensing nodes SAI and configured to receive the voltages VC having the constant levels from the sensing nodes SAI. The nonvolatile memory apparatus 3 further may include a plurality of column switches 641 to 643 for receiving respective bit line selection signals BLS0<0>, BLS1<0>, and BLS2<0> and a plurality of row switches 651 to 653 for receiving respective word line selection signals WLS<0>, WLS<1>, and WLS<2>. The nonvolatile memory apparatus 3 can select the memory cells 631 to 633 on which a read operation or a write operation is performed by selecting the column switches 641 to 643 and the row switches 651 to 653.

In an embodiment, the number of comparators 621-1, 622-1, and 623-1 in the elements of the voltage generation units 621 to 623 can be smaller than the number of drivers for driving the respective sensing nodes SAI coupled with a plurality of memory cells included in a memory block. That is, a plurality of drivers coupled with a plurality of memory cells included in one memory block can share one comparator.

While various embodiments have been described above, it will be understood to those skilled in the art that the embodiments described are by way of example only. Accordingly, the nonvolatile is memory apparatus described herein should not be limited based on the described embodiments. Rather, the apparatus described herein should only be limited in light of the claims that follow when taken in conjunction with the above description and accompanying drawings.

What is claimed is:

1. A nonvolatile memory apparatus, comprising:
a read/write control unit configured to supply a bias voltage in response to a read control signal, a write control signal and data;
a voltage generation unit configured to compare a level of the bias voltage with a voltage level of a sensing node and drive the sensing node at voltage having a constant level based on a result of the comparison; and
a memory cell coupled with the sensing node and configured to receive the voltage having the constant level,
wherein the read/write control unit comprises a control signal generator configured to generate digital code signals in response to the read control signal, the write control signal and the data and a Digital Analog Converter configured to generate the bias voltage in response to the digital code signals.

2. The nonvolatile memory apparatus according to claim 1, wherein the voltage generation unit comprises:
a comparator configured to compare the level of the bias voltage with the voltage level of the sensing node and generate a comparison signal based on a result of the comparison; and
a driver configured to drive the sensing node at a power source voltage in response to the comparison signal.

3. The nonvolatile memory apparatus according to claim 1, further comprising a current sensing unit coupled with the sensing node and configured to compare a sensing current flowing through the memory cell with a reference current and generate a data output signal based on a result of the comparison.

4. The nonvolatile memory apparatus according to claim 1, further comprising:
a column switch configured to couple the sensing node with the memory cell in response to a bit line selection signal; and
a row switch configured to couple the memory cell and a terminal for a ground voltage in response to a word line selection signal.

5. A nonvolatile memory apparatus, comprising:
a sharing driver unit configured to supply a sensing node with voltage having a constant level in response to a read control signal, a write control signal and data;

a memory cell configured to have a first terminal coupled with the sensing node and receive the voltage having the constant level; and a current sensing unit coupled with a second terminal of the memory cell and configured to sense an electric current flowing through the memory cell and generate a data output signal based on a result of the sensing, wherein the sharing driver comprises a control signal generator configured to generate digital code signals in response to the read control signal, the write control signal and the data, a Digital Analog Converter configured to generate the bias voltage in response to the digital code signals and a voltage generation unit configured to compare a level of the bias voltage with a voltage level of the sensing node and drive the sensing node at the voltage having the constant level based on a result of the comparison.

6. The nonvolatile memory apparatus according to claim 5, wherein the voltage generation unit comprises:

a comparator configured to compare the level of the bias voltage with the voltage level of the sensing node and generate a comparison signal based on a result of the comparison; and a driver configured to drive the sensing node at a power source voltage in response to the comparison signal.

7. The nonvolatile memory apparatus according to claim 5, further comprising a column switch configured to couple the sensing node with the first terminal of the memory cell in response to a bit line selection signal.

8. The nonvolatile memory apparatus according to claim 5, further comprising a row switch configured to couple the second terminal of the memory cell with a terminal for a ground voltage in response to a word line selection signal, wherein the current sensing unit senses a sensing current flowing through the memory cell between the memory cell and the row switch.

9. A nonvolatile memory apparatus, comprising:

a sharing read/write control unit configured to supply a bias voltage to a plurality of memory blocks in response to a read control signal, a write control signal and data;

a block switch configured to supply the bias voltage to a memory block, selected from the plurality of memory blocks, in response to a block selection signal;

a voltage generation unit configured to receive the bias voltage from the block switch, compare a level of the received bias voltage with a voltage level of a sensing node, and drive the sensing node at voltage having a constant level based on a result of the comparison; and a memory cell coupled with the sensing node and configured to receive the voltage having the constant level, wherein the sharing read/write control unit comprises a control signal generator configured to generate digital code signals in response to the read control signal, the write control signal and the data and a Digital Analog Converter configured to generate the bias voltage in response to the digital code signals.

10. The nonvolatile memory apparatus according to claim 9, wherein the Digital Analog Converter comprises:

a set Digital Analog Converter configured to generate the bias voltage, corresponding to set data, in response to the digital code signals; and a reset Digital Analog Converter configured to generate the bias voltage, corresponding to reset data, in response to the digital code signals, wherein one of the set and the reset Digital Analog Converters generates the bias voltage, corresponding to a read voltage in response to the digital code signals.

11. The nonvolatile memory apparatus according to claim 9, wherein the voltage generation unit comprises:

a comparator configured to compare the level of the bias voltage with the voltage level of the sensing node and generate a comparison signal based on a result of the comparison; and a driver configured to drive the sensing node at a power source voltage in response to the comparison signal.

12. The nonvolatile memory apparatus according to claim 9, further comprising:

a column switch configured to couple the sensing node with one terminal of the memory cell in response to a bit line selection signal; and a row switch configured to couple another terminal of the memory cell and a terminal for a ground voltage in response to a word line selection signal.

13. The nonvolatile memory apparatus according to claim 12, further comprising a current sensing unit coupled with the sensing node and configured to compare a sensing current flowing through the memory cell with a reference current and generate a data output signal based on a result of the comparison.

14. The nonvolatile memory apparatus according to claim 12, further comprising a current sensing unit coupled between the memory cell and a word line and configured to compare a sensing current flowing through the memory cell with a reference current and generate a data output signal based on a result of the comparison.

* * * * *